(12) United States Patent
O'Neill

(10) Patent No.: US 8,174,108 B2
(45) Date of Patent: May 8, 2012

(54) METHOD FOR FACILITATING THE STACKING OF INTEGRATED CIRCUITS HAVING DIFFERENT AREAS AND AN INTEGRATED CIRCUIT PACKAGE CONSTRUCTED BY THE METHOD

(75) Inventor: Peter Mark O'Neill, Fort Collins, CO (US)

(73) Assignee: Avago Technologies Enterprise IP (Singapore) Pte. Ltd., Singapore (SG)

( * ) Notice: Subject to any disclaimer, the term of this patent is extended or adjusted under 35 U.S.C. 154(b) by 170 days.

(21) Appl. No.: 12/730,947

(22) Filed: Mar. 24, 2010

(65) Prior Publication Data
US 2011/0233757 A1  Sep. 29, 2011

(51) Int. Cl.
*H01L 23/02* (2006.01)
(52) U.S. Cl. .............. 257/686; 257/E25.013; 257/685; 257/777; 438/108; 438/109
(58) Field of Classification Search ........... 257/E21.499, 257/E25.029, 685, 686, 712, 777, 778, E25.013; 438/107–109; 361/760
See application file for complete search history.

(56) References Cited

U.S. PATENT DOCUMENTS

| | | | |
|---|---|---|---|
| 5,926,615 A | 7/1999 | Hwu et al. | |
| 6,791,195 B2 * | 9/2004 | Urushima | 257/783 |
| 6,946,325 B2 * | 9/2005 | Yean et al. | 438/112 |
| 7,768,113 B2 * | 8/2010 | Ozguz et al. | 257/686 |
| 7,884,464 B2 * | 2/2011 | Yew et al. | 257/698 |
| 8,008,125 B2 * | 8/2011 | McConnelee et al. | 438/109 |
| 2004/0025322 A1 | 2/2004 | Binnard | |
| 2004/0033654 A1 * | 2/2004 | Yamagata | 438/202 |
| 2006/0022330 A1 | 2/2006 | Mallari | |
| 2008/0211081 A1 * | 9/2008 | Lee | 257/691 |
| 2008/0315230 A1 * | 12/2008 | Murayama | 257/98 |

FOREIGN PATENT DOCUMENTS

JP  1089448 A  4/1989

OTHER PUBLICATIONS

Schulte, E., MEMS Submillimeter Imaging Array Poses Fabrication Challenges, Semiconductor International Astronomy Technology Centre, Edinburg, Sep. 15, 2004, available online at http://www.semiconductor.net/article/197352-MEMS_Submillimeter_Imaging_Array_Poses_Fabrication_Challenges.php?rssid=20279.

* cited by examiner

*Primary Examiner* — Chris Chu

(57) ABSTRACT

An integrated circuit package comprises a package substrate, an application specific integrated circuit (ASIC) having a first area and formed on a first wafer made from a select semiconductor material, a second wafer of the select semiconductor material, and a supplemental-integrated circuit. The supplemental-integrated circuit has a second area different from the first area. The first wafer includes a through-wafer via to couple the ASIC to the package substrate. An active surface of the ASIC is coupled to the second wafer. The second wafer is arranged with a window there through that is sized to closely receive and align one or more bonding interfaces of the supplemental-integrated circuit to respective bonding interfaces of the ASIC. A corresponding method for assembling a die-stacked integrated circuit package is disclosed.

13 Claims, 10 Drawing Sheets

METHOD FOR FACILITATING THE STACKING OF INTEGRATED CIRCUITS HAVING DIFFERENT AREAS AND AN INTEGRATED CIRCUIT PACKAGE CONSTRUCTED BY THE METHOD

BACKGROUND

A modern application specific integrated circuit (ASIC) requires a significant amount of random access memory (RAM) to operate satisfactorily. In an example, for networking applications, the memory needs to be accessed at a high rate with low latency. Often, a single ASIC chip needs to read and write independently to multiple memory elements. One present solution to the need for ASIC memory access is to use dynamic RAM (DRAM) embedded in a logic process, so-called embedded DRAM or eDRAM, to locate memory near the logic that accesses it and to connect the memory to the logic using a wide bus. eDRAM memory is dense and, being on the same die with the ASIC logic, allows dense, high-speed interconnections between the memory and the logic. eDRAM also avoids the slow, narrow, power-hungry interface entailed in connecting a logic die to separate DRAM dice through either packages and a printed circuit board (PCB) or in a side-by-side multi-chip module (MCM).

Embedded DRAM however presents a number of challenges. The additional processing steps to embed the memory with the logic both increases manufacturing costs and reduces yield. The embedded DRAM is not as dense as it is in a dedicated DRAM. Lastly, embedded DRAM technology is not widely available.

In integrated circuit (IC) technology, a circuit almost always performs better and costs less when it is constructed using a semiconductor manufacturing process that is optimal for the particular function performed by the circuit, so partitioning the system into separate logic and DRAM integrated circuits is attractive. The high parasitics of the connection between separate dice on a PCB or even an MCM substrate might be alleviated by stacking one die on the other. However, until recently, stacked dice have almost always been connected by wire bonds along their respective perimeters, which greatly limit the number and the quality of the connections. For many communication system and networking applications, multiple wide logic to memory buses with low parasitics are desired.

Recently, interconnect technologies known as fine pitch through-silicon via (TSV) and metal-to-metal bonds have been developed to enable the fabrication of stacked dice having an area array interconnect in a "through-silicon stacking" (TSS) architecture. An area array interconnect using TSVs and metal-to-metal bonds provide physically short, relatively low parasitic connections, to provide what can be referred to as, "I/O-less on-circuit access to off-circuit technology." Such through-silicon stacking allows the consideration of partitioning an IC device into separate logic and DRAM dice.

In general, it is often the situation that an application specific integrated circuit (ASIC) device will use more area than a DRAM circuit. As a result, stacking the smaller DRAM on a larger ASIC and arranging a heat sink on top of the stack is inefficient for transferring heat generated in the ASIC through the DRAM to the heat sink. While thermally conductive materials are known for filling imperfections in mating surfaces of integrated circuits and heat sinks, these thermally conductive materials are not nearly as efficient at transferring heat as semiconductor materials and metals over the thickness or height of an integrated circuit.

Moreover, data processing speed and efficiency of many ASICs and ASIC-based assemblies, depend in large part, on how internally generated heat is controlled and removed from the circuits. Existing heat sinks and heat exchangers do not, in all instances, effectively control and remove internally generated heat, especially in the context of stacked dies that produce gaps between an active surface of an ASIC and a heat sink.

SUMMARY

An embodiment of an integrated circuit package comprises an application specific integrated circuit (ASIC) having a first area and manufactured on an active surface of a first wafer, a second wafer having at least one window or opening there through, a supplemental-integrated circuit having a second area different from the first area and appropriately sized to be closely received in the window in the second wafer, and a package substrate. The first wafer and the second wafer comprise a select semiconductor material. The first wafer has at least one through-wafer via that couples the ASIC to the package substrate. The supplemental-integrated circuit has a respective active surface arranged such that a first conductor on the respective active surface is in registration with a corresponding conductor of the ASIC.

An embodiment of a method for facilitating the stacking of integrated circuits having different areas to construct an integrated circuit package includes the steps of fabricating an application specific integrated circuit having a first area on an active surface of a first wafer, the first wafer comprising a select semiconductor material, selectively removing material from a second wafer comprising the select semiconductor material to form a window through the second wafer, arranging the second wafer in registration to the first wafer, placing a supplemental-integrated circuit different from the application specific integrated circuit and having a second area different from the first area in the window, the supplemental-integrated circuit having a respective active surface and bonding the respective active surface of the supplemental-integrated circuit to the active surface of the application specific integrated circuit on the first wafer.

The figures and detailed description that follow are not exhaustive. The disclosed embodiments are illustrated and described to enable one of ordinary skill to make and use the integrated circuit package and method for facilitating the stacking of integrated circuits having different areas. Other embodiments, features and advantages will be or will become apparent to those skilled in the art upon examination of the following figures and detailed description. All such additional embodiments, features and advantages are within the scope of the assemblies and methods for the manufacture of the assemblies as defined in the accompanying claims.

BRIEF DESCRIPTION OF THE FIGURES

The integrated circuit packages and methods for constructing the same can be better understood with reference to the following figures. The components within the figures are not necessarily to scale, emphasis instead being placed upon clearly illustrating the principles of forming a second wafer with a window to guide a supplemental-integrated circuit device into registration with an active surface of an ASIC. Moreover, in the figures, like reference numerals designate corresponding parts throughout the different views.

DETAILED DESCRIPTION

Figure 1:
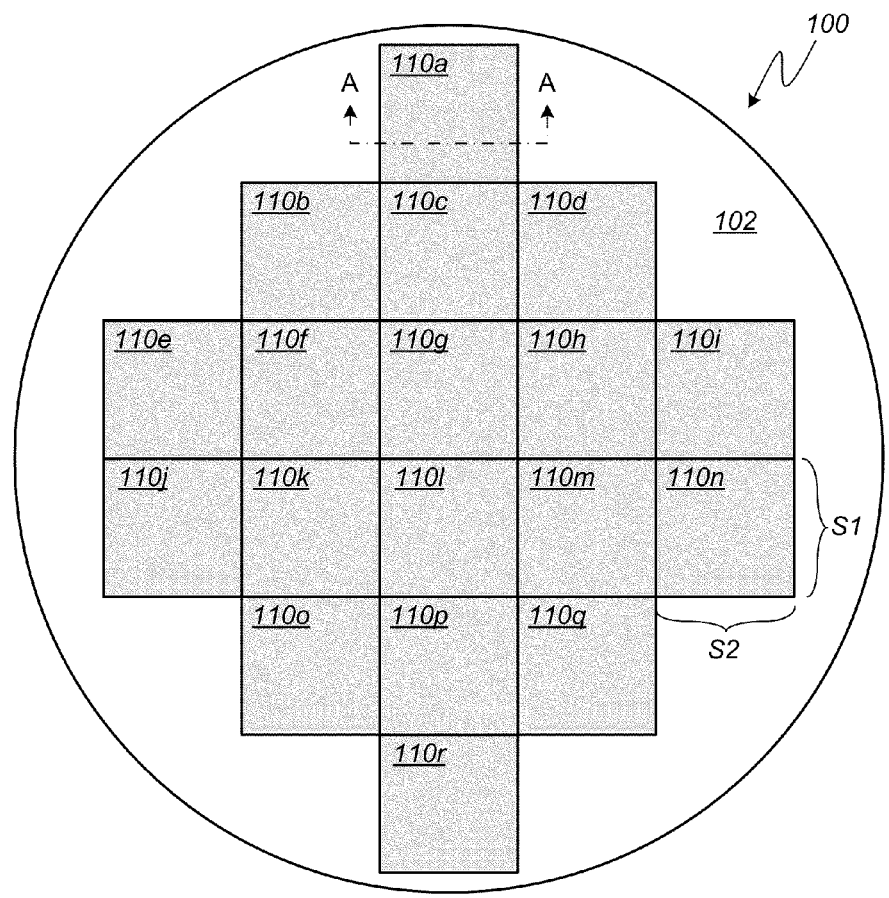
FIG. 1 is a schematic representation including a top plan view of a first wafer.

Developments in through-silicon via (TSV) technology have made it practical to overlay or stack integrated circuit dice with high-density, high-speed signal interconnects. Fabricating TSVs generally requires external mechanical support of the wafer while the wafer or die is thinned to expose the vias. Typically, the wafer is thinned by grinding or polishing a surface. The thinning process can cause undesired warping of the wafer without suitable mechanical support. Thinning a base wafer after stacking die upon it, though more convenient than thinning it before stacking, makes supporting the wafer during thinning problematic.

Furthermore, as integrated circuit manufacturing technologies advance permitting circuit designers to arrange more circuit devices in smaller areas, these circuit devices and elements in their relatively higher-density arrangements dissipate more power from within smaller areas, making thermal design important to the successful operation of the integrated circuit.

Partitioning by both function and fabrication technology, coupled with the benefits of through-silicon via technology and the economics of integrated circuit design and fabrication, make it likely that application-specific integrated circuits (ASICs) and supplemental-integrated circuits stacked thereon will have different areas. Signal and power quality dictate that the generally larger ASIC be mounted closest to a package substrate, with smaller supplemental-integrated circuits stacked or arranged on top of the ASIC. Since package heat sinks are placed on the top of the assembly, heat generated within the ASIC flows through the supplemental-integrated circuit and on to the heat sink. The arrangement of a smaller supplemental-integrated circuit above a larger ASIC can result in an undesirable transfer of heat through the supplemental-integrated circuit.

The present packages and methods for die-stacking integrated circuit dice apply a thermally conductive paste or gel in the volume or space above an underlying ASIC and surrounding an overlaying supplemental-integrated circuit. The thermally conductive paste or gel can flow. Consequently, this thermally conductive medium can absorb any thermal expansion mismatch between the underlying ASIC and the heat sink. The thermal conductivity of the paste or gel is not as high as that of the silicon supplemental die it surrounds. However, when the thermally conductive medium is made from the same semiconductor material that was used for manufacturing the ASIC, a higher thermal conductivity path is provided from the underlying ASIC to the heat sink, while matching the thermal expansion of the ASIC. The thermally conductive medium is in the form of a second wafer of a select semiconductor material (e.g., silicon) with a window or windows there through. The overlaying or second wafer is arranged in registration with an underlying or first wafer having one or more ASICs such that the window(s) are vertically aligned with a mounting location on the active surface of the ASIC. The overlaying wafer can be bonded or otherwise coupled to the underlying wafer once the two wafers are in alignment with each other. Once coupled, the overlaying wafer increases the rigidity of the combination and may serve as a mechanical support for a device that holds the combination of wafers while the lower surface of the underlying wafer is ground or polished to expose TSVs.

The windows in the overlaying wafer provide a template or guide for closely receiving a suitable supplemental-integrated circuit that is bonded or otherwise coupled to the active surface ASIC. The overlaying wafer holds the supplemental-integrated circuits in alignment with a respective ASIC until all have been placed, so that they can be bonded to the underlying ASIC in a single batch temperature and pressure cycle. Thereafter, a ring is formed surrounding each of the supplemental-integrated circuits by singulating or separating the overlaying wafer together with the underlying ASIC. When the overlaying wafer is made from the same semiconductor material that was used to manufacture the underlying ASIC, thermal expansion and stress are minimized. The exposed surfaces of the overlaying wafer and the supplemental-integrated circuit are substantially coplanar and provide a greater surface area for mounting a heat sink having a greater contact area and a more direct thermal path from the underlying ASIC than what would otherwise be possible in the absence of the overlaying wafer.

Moreover, because the ring or overlaying wafer is made from a semiconductor material, the material provides additional area for the manufacture of electrical devices using manufacturing techniques that are different and perhaps incompatible with the manufacturing technique or techniques used to manufacture the ASIC and technique or techniques used to manufacturing the supplemental-integrated circuit. Electrical devices formed in the overlaying wafer can include medium frequency bypass capacitors, higher-voltage field-effect transistors and low resistance conductors. These devices can be connected through the through wafer vias to the substrate package. In addition, these devices can be manufactured from a less expensive manufacturing process than those used to manufacture either the ASIC or the supplemental-integrated circuit.

Accordingly, the addition of the second wafer to the first wafer provides rigidity or stability for a mechanical polishing or grinding of the first wafer. In addition, the addition of the second wafer in registration with the first wafer provides a template or guide for placing one or more supplemental-integrated circuits on a mounting portion of a corresponding ASIC, thus, permitting a batch coupling or bonding of the supplemental-integrated circuits to the corresponding ASICs. Furthermore, the second wafer provides additional semiconductor material for forming circuit elements that are not well suited for integration with the ASIC or with the supplemental-integrated circuit. Moreover, the second wafer provides additional semiconductor material for transferring heat from the ASIC to a heat sink in close contact with the second wafer and the integrated circuit in the window.

In addition to the above-described advantages, when the exposed surfaces of the second wafer and the supplemental-integrated circuit are coplanar, the available contact area is greater than that provided solely by the exposed surface of the supplemental-integrated circuit, thus permitting the use of a heat sink with a larger contact surface to remove heat from the integrated circuit package.

Turning now to the drawings, wherein like reference numerals designate corresponding parts throughout the drawings, reference is made to FIG. 1, which includes a top plan view of a first wafer. The first wafer 100 includes ASICs 110 which have been manufactured on an active surface 102. In the illustrated embodiment, the first wafer 100 is circular in shape and sized to support the manufacture of ASICs 110a-110r, which are substantially rectangular in shape and arranged orthogonally in rows and columns. Each of the ASICs 110a-110r include an area defined by the product of the lengths of side S1 and side S2. In alternative embodiments, the ASICs 110 may be fewer in number or greater in number as permitted by the diameter of the first wafer 100 and the area required for each of the ASICs 110.

Figure 2:
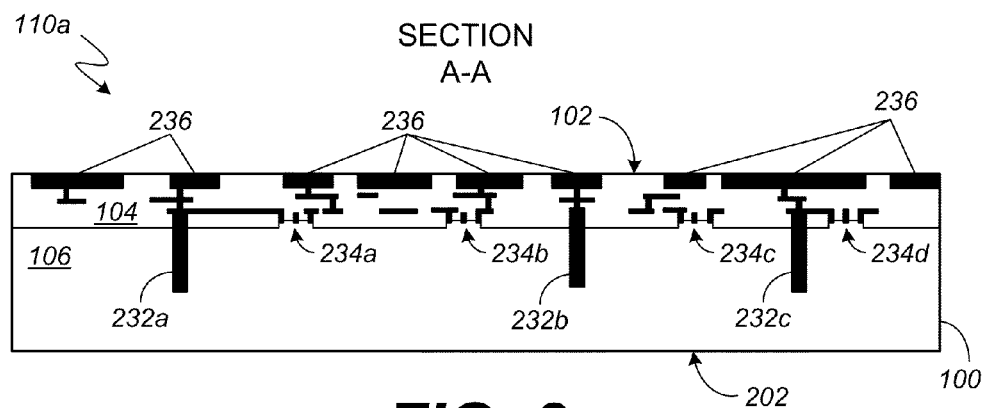
FIG. 2 is a cross-sectional view of a portion of an ASIC of the first wafer of FIG. 1.

FIG. 2 is a cross-sectional view of the ASIC 110a in the direction A-A as indicated in FIG. 1. As shown in Section A-A (FIG. 2), the ASIC 110a includes an active region 104 arranged above an inactive region 106. The active region 104 includes active circuit devices such as transistors 234a-234d distributed along the active region 104. The inactive region 106 includes inactive circuit elements, such as the substantially vertically arranged conductors 232a-232c. The inactive region 106 is thicker in length (i.e., it extends further) than the depth of the vertically arranged conductors 232a-232c, which will be exposed to provide through-wafer vias in a subsequent manufacturing process.

The ASIC 110a includes various electrically and thermally conductive features arranged along the active surface 102. The thermally conductive features include contacts 236. Preferably, the contacts 236 are made from a metal or an alloy and the first wafer 100 is made from a semiconductor material such as silicon. In alternative embodiments, the first wafer 100 can be made from other semiconductor materials and combinations thereof.

Direct metal-to-metal bonds, including those bonds with solder joints, such as those supported by the contacts 236, have a significantly higher thermal conductivity than alternative assemblies that are joined to each other with an adhesive layer or assemblies that include an arrangement of adjacent dielectrics that are not bonded to one another. Stated another way, contacts 236 provide a physical support for bonding or coupling the ASIC 110a to one or more external devices and an interface that has a relatively higher thermal conductivity than that of an adhesive joint or that of adjacently arranged dielectrics.

A first subset of contacts provides a physical support for thermal conductivity and mechanical bonding or coupling. That is, members of the first subset of contacts are not electrically or physically coupled to circuit devices or to TSVs. A second subset of contacts provides a direct electrical connection to a TSV absent additional connections to conductors or circuit elements in the ASIC 110. The second subset of contacts enables a supplemental-integrated circuit (SIC) to be powered from a different supply than that used to power the ASIC. In addition, the second subset of contacts enables the SIC to communicate directly to external devices through a package. A third subset of contacts provides for an electrically conductive coupling of circuit elements on the ASIC 110 with one or more resources in the SIC. For example, the ASIC 110 can use memory provided on the SIC.

Figure 3:
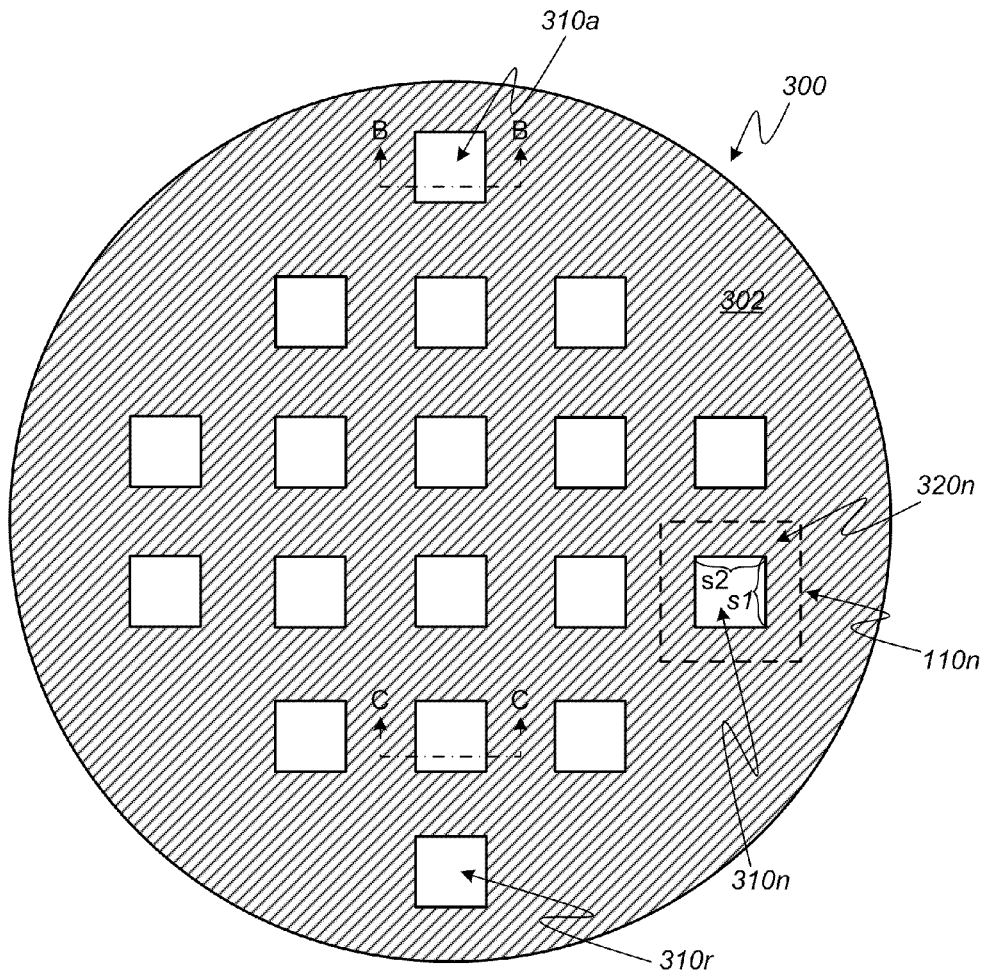
FIG. 3 is a schematic representation of a top plan view of a second wafer.

FIG. 3 is a schematic representation of a top plan view of a second wafer 300. Preferably, the second wafer 300 is made from the same semiconductor material or combination of semiconductor materials that was used to produce the first wafer 100 (FIG. 1). The second wafer 300 has an upper surface 302 and includes windows 310a-310r, where material has been selectively removed to form a hole or passage through the second wafer 300. In practice, the windows 310 can be created with an ultraviolet laser, by using deep-reactive ion etching, and possibly by directing an abrasive slurry jet to form generally rectangular-shaped passages through the second wafer 300. As shown in FIG. 3, the windows 310a-310r are distributed or spaced orthogonally (i.e., in rows and columns) across the second wafer 300. In the illustrated embodiment, the second wafer 300 is circular in shape and sized such that when the second wafer 300 is in alignment with the first wafer 100, the windows 310a-310r are in alignment or registration with corresponding or respective mounting areas of the ASICs 110a-110r (FIG. 1). The dashed line reveals the relative location and area of the ASIC 110n. Each window 310a-310r provides an area defined by the product of the lengths of side s1 and side s2. The length of side s1 is smaller than the respective length of S1 of the ASIC 110n. Similarly, the length of side s2 is smaller than the respective length of S2 of the ASIC 110n. Thus, the ASIC 110n has an area that is larger than that of the corresponding window 310n. Moreover, the dashed line in FIG. 3 reveals that if the first wafer 100 and second wafer 300 are singulated along the dashed line that the second wafer 300 forms a frame or ring 320n that surrounds the opening or window 310n through the second wafer 300.

In alternative embodiments, the windows 310 may be fewer in number or greater in number as may be required to provide a suitably sized corresponding window 310 in registration with a mounting portion for each respective ASIC 110 on the first wafer 100. Moreover, the size and shape of the windows 310a-310r may vary with the area of a supplemental-integrated circuit and a desired tolerance for receiving an example of the same in a respective window 310 as will be explained in greater detail in association with FIG. 9.

Figure 4:
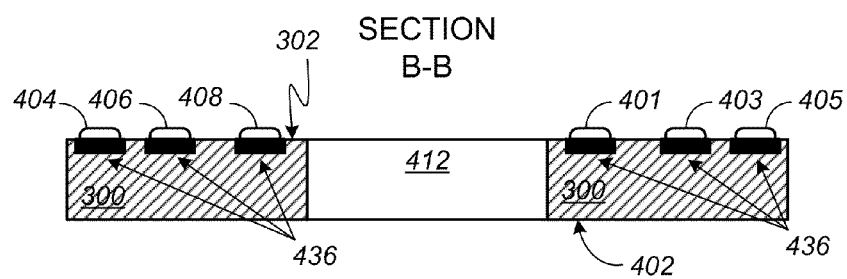
FIG. 4 is a cross-sectional view of an embodiment of a portion of the second wafer of FIG. 3.

FIG. 4 is a cross-sectional view in the direction B-B of an embodiment of a portion of the second wafer 300 of FIG. 3. As illustrated in FIG. 4, the second wafer 300 has a first or upper surface 302 and an opposed or second surface 402. In the illustrated embodiment, the second wafer 300 is devoid of circuit elements and surface 412 is visible. Contacts 436 similar in construction and size to the contacts 236 on the active surface 102 of the first wafer 100 (FIG. 2), can be arranged along one of the first or upper surface 302 or the opposed or second surface 402. In the illustrated embodiment, the contacts 436 are arranged along the first or upper surface 302 and each contact 436 is provided a respective solder bump. Solder bumps 401, 403 and 405 are arranged with respective contacts 436 on the right side of the second wafer 300. Similarly, solder bumps 404, 406, and 408 are arranged with respective contacts 436 on the left side of the second wafer 300. The contacts 436 and respective solder bumps 401, 403, 405, 404, 406, 408 enable the second wafer 300 to be physically bonded or coupled to the first wafer 100. As explained above, the contacts 436 and respective solder bumps 401, 403, 405, 404, 406, 408 provide a physical connection with increased heat transfer capability. In alternative embodiments, the second wafer 300 may be configured with contacts 436 and respective solder bumps 401, 403, 405, 404, 406, 408 fewer in number or greater in number as may be desired.

Figure 5:
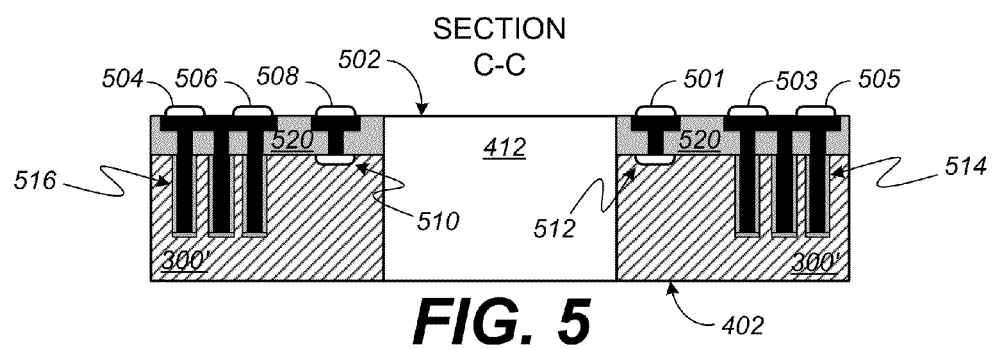
FIG. 5 is a cross-sectional view of an alternative embodiment of a portion of the second wafer of FIG. 3.

FIG. 5 is a cross-sectional view in the direction C-C of an alternative embodiment of a portion of the second wafer 300 of FIG. 3. As shown in FIG. 5, the second wafer 300' has a first or upper surface 502 and an opposed or second surface 402. In the illustrated embodiment, the second wafer 300' further includes reactive elements such as a capacitor 514 and a capacitor 516. The capacitor 514 and a capacitor 516 are arranged in an insulating layer 520 and are constructed using the same manufacturing technology as the TSVs 232a, 232b and 232c in the ASIC 110. The insulating layer 520 is a dielectric material that is deposited to line the trench. Solder bumps 503, 505 are arranged along the surface of a first contact of the capacitor 514. Solder bump 501 is arranged along the surface of a second contact of the capacitor 514. The contact coupled to the solder bump 501 extends to a diffusion region 512 having the same doping type as the second wafer 300'. Solder bumps 504, 506 are arranged along the surface of a first contact of the capacitor 516. Solder bump 508 is arranged along the surface of a second contact of the capacitor 516. The contact coupled to the solder bump 508 extends to a diffusion region 510 having the same doping type as the second wafer 300'.

Figure 6:
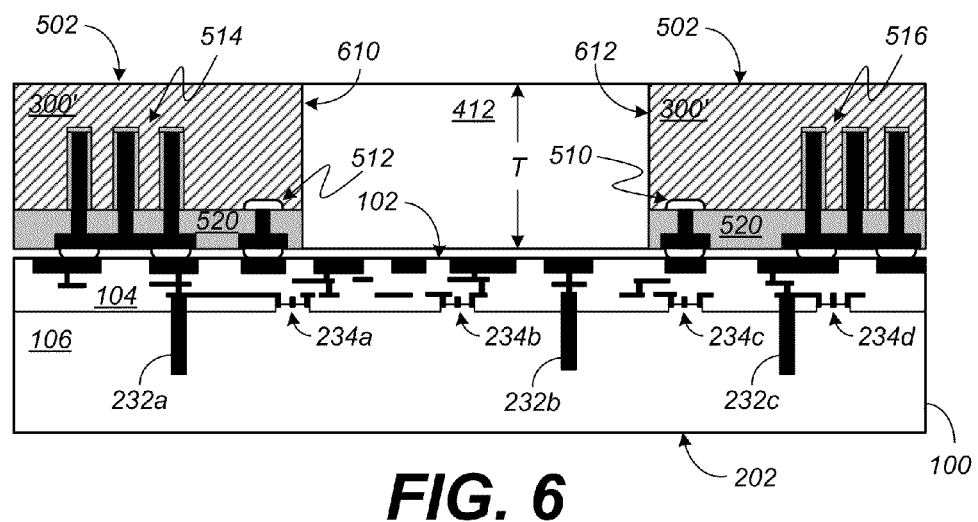
FIG. 6 is a cross-sectional view of the portion of the second wafer of FIG. 5 in registration with the portion of the ASIC of FIG. 2.

As illustrated in FIG. 6, the first and second contacts together with the solder bumps 503, 505 and 501 of the capacitor 514 are arranged for coupling with corresponding contacts and circuit elements arranged along the active surface 102 of the ASIC 110a (FIG. 2). Similarly, the first and second contacts together with the solder bumps 504, 506 and 508 of the capacitor 516 are arranged for coupling with corresponding contacts and circuit elements arranged along the active surface 102 of the ASIC 110a. The cross-sectional view of FIG. 6 shows how the active surface 102 of the ASIC 110a, and the left-side wall 610, the right-side wall 612 and the rear wall 412 of the second wafer 300' partially enclose a volume having a base area s1×s2 and a thickness or height T. As shown in conjunction with FIGS. 9 and 10A-10C, the partially enclosed volume is capable of receiving a suitably arranged supplemental-integrated circuit.

As with the active surface 102 of the ASIC 110a, some additional contacts and solder bumps (not shown) may be provided for physical connection and heat transfer only, while the remaining contacts may provide physical and electrical connectivity as well as increased heat transfer.

In this embodiment, the second wafer 300' provides additional semiconductor material for forming circuit elements (e.g., the capacitor 514 and the capacitor 516) that are not well suited for integration with the ASIC 110a or with a supplemental-integrated circuit that is later integrated in a stacked configuration. The second wafer 300' provides a semiconductor medium for the manufacture of circuit elements that are not well suited for manufacturing techniques used to produce the ASIC 110 and or a supplemental-integrated circuit (e.g., high-power field-effect transistors). Not only can a manufacturing process that is less expensive than the manufacturing process used to manufacture either the ASIC 110 or the supplemental-integrated circuit be used to create circuit elements, the second wafer 300' provides additional design flexibility in that supply voltages coupled to the circuit elements in the second wafer 300' can be different from supply voltages that are used to power circuit elements in the ASIC 110 or a supplemental-integrated circuit.

Figure 7:
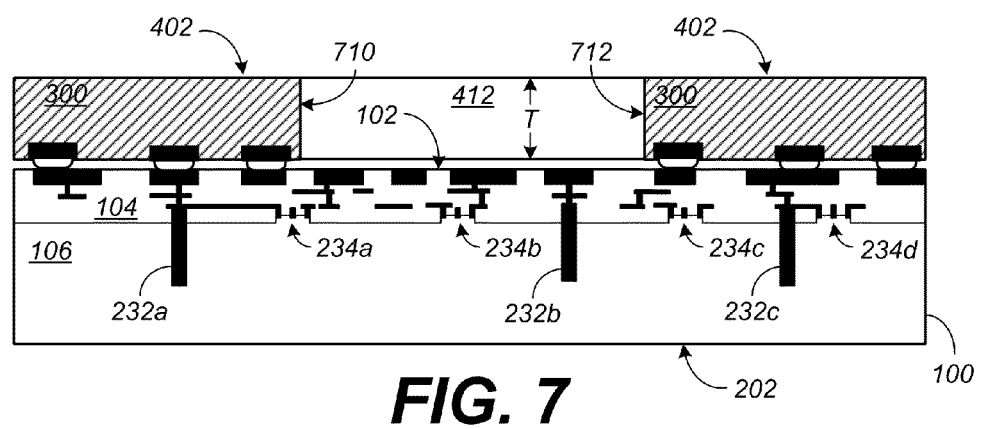
FIG. 7 is a cross-sectional view of the portion of the second wafer of FIG. 4 in registration with the portion of the ASIC of FIG. 2.

FIG. 7 is a cross-sectional view of the portion of the second wafer 300 of FIG. 4 in registration with the portion of the ASIC 110a of FIG. 2. As illustrated in FIG. 7, the contacts together with the respective solder bumps are arranged for physically coupling the second wafer 300 to the active surface 102 of the ASIC 110a (FIG. 2). The cross-sectional view of FIG. 7 shows how the active surface 102 of the ASIC 110a, and the left-side wall 710, the right-side wall 712 and the rear wall 412 of the second wafer 300 partially enclose a volume having a base area s1×s2 and a thickness or height T. As shown in conjunction with FIGS. 9 and 10A-10C, the partially enclosed volume is capable of receiving a suitably arranged supplemental-integrated circuit. Additional contacts and solder bumps (not shown) may be provided for physical connection and heat transfer only. In this embodiment, the second wafer 300 provides additional semiconductor material for physical support of the ASIC 110a and for increased heat transfer from the active surface 102 of the ASIC 110a.

Figure 8:
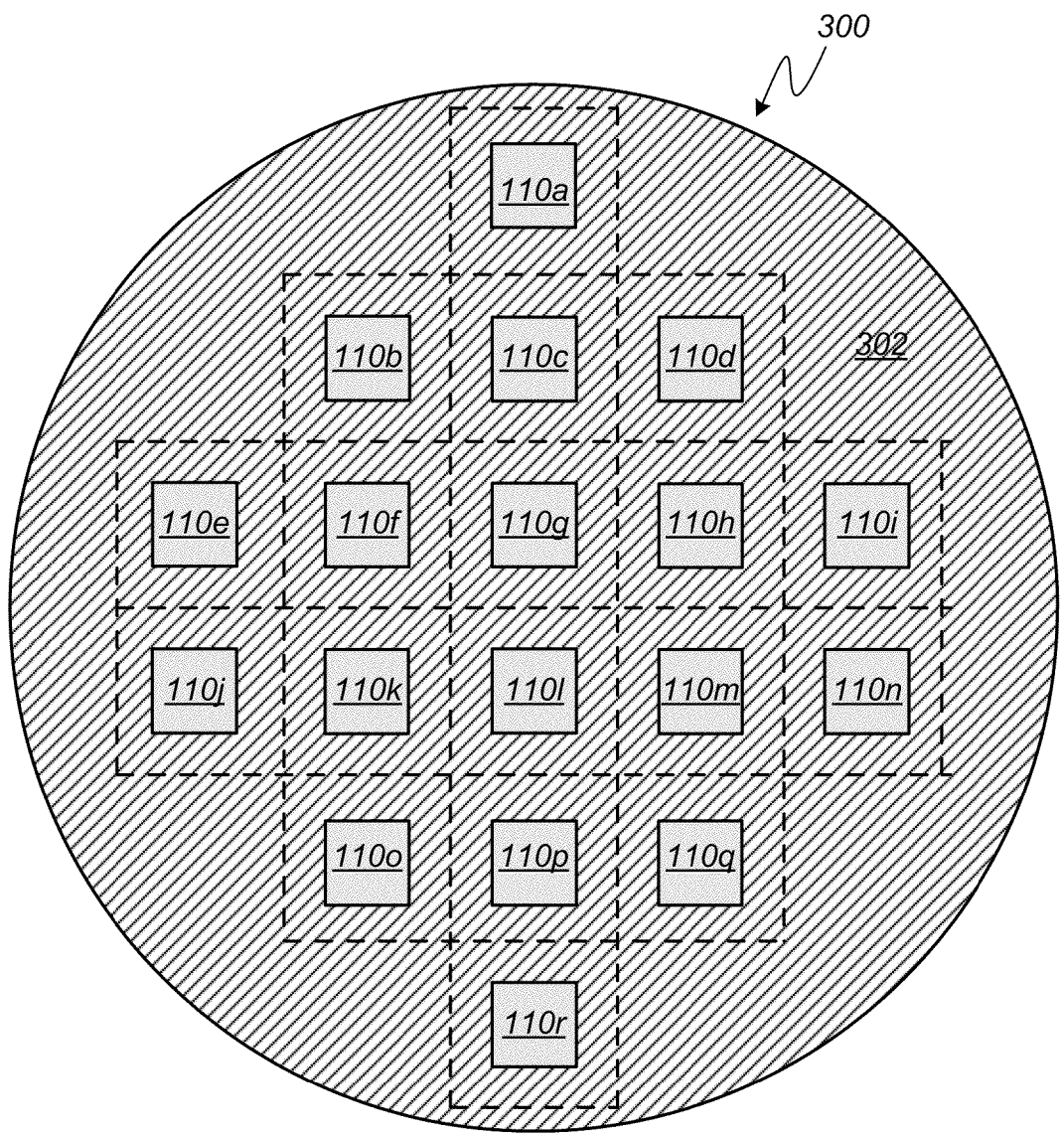
FIG. 8 is a schematic representation of a top plan view of the second wafer of FIG. 3 bonded to the first wafer of FIG. 1.

FIG. 8 is a schematic representation of a top plan view of the second wafer 300 of FIG. 3 in registration with and bonded to the first wafer 100 of FIG. 1. When the first wafer 100 and the second wafer 300 share the same shape and size it is relatively easy to stack the second wafer 300 (e.g., a second wafer absent additional circuit elements) or the second wafer 300' (e.g., a second wafer with additional reactive and active circuit elements) above the first wafer 100 such that the active surface 102 of the first wafer 100 and the respective upper surface 302 or upper surface 502 of the second wafer 300 or second wafer 300' closely contact one another. Respective index mark(s) (not shown) arranged along the edge of the first wafer 100 and the second wafer 300 may assist in the desired registration or alignment of the windows 310a-310r with a respective mounting region of the corresponding ASIC 110a-110r.

Once the first wafer 100 and the second wafer 300 are in registration with each other and bonded or coupled together to form a multiple wafer assembly, the windows 310a-310r in the second wafer 300 provide a template or guide for the placement of a corresponding supplemental-integrated circuit intended to be coupled to the underlying ASIC 110. In addition, the second wafer 300 adds rigidity to the first wafer 100 and can provide additional surface area for coupling the multiple wafer assembly in a mechanical fixture for a subsequent grinding or polishing of the first wafer 100 to expose through wafer vias in the respective ASICs 110a-110r.

Figure 9:
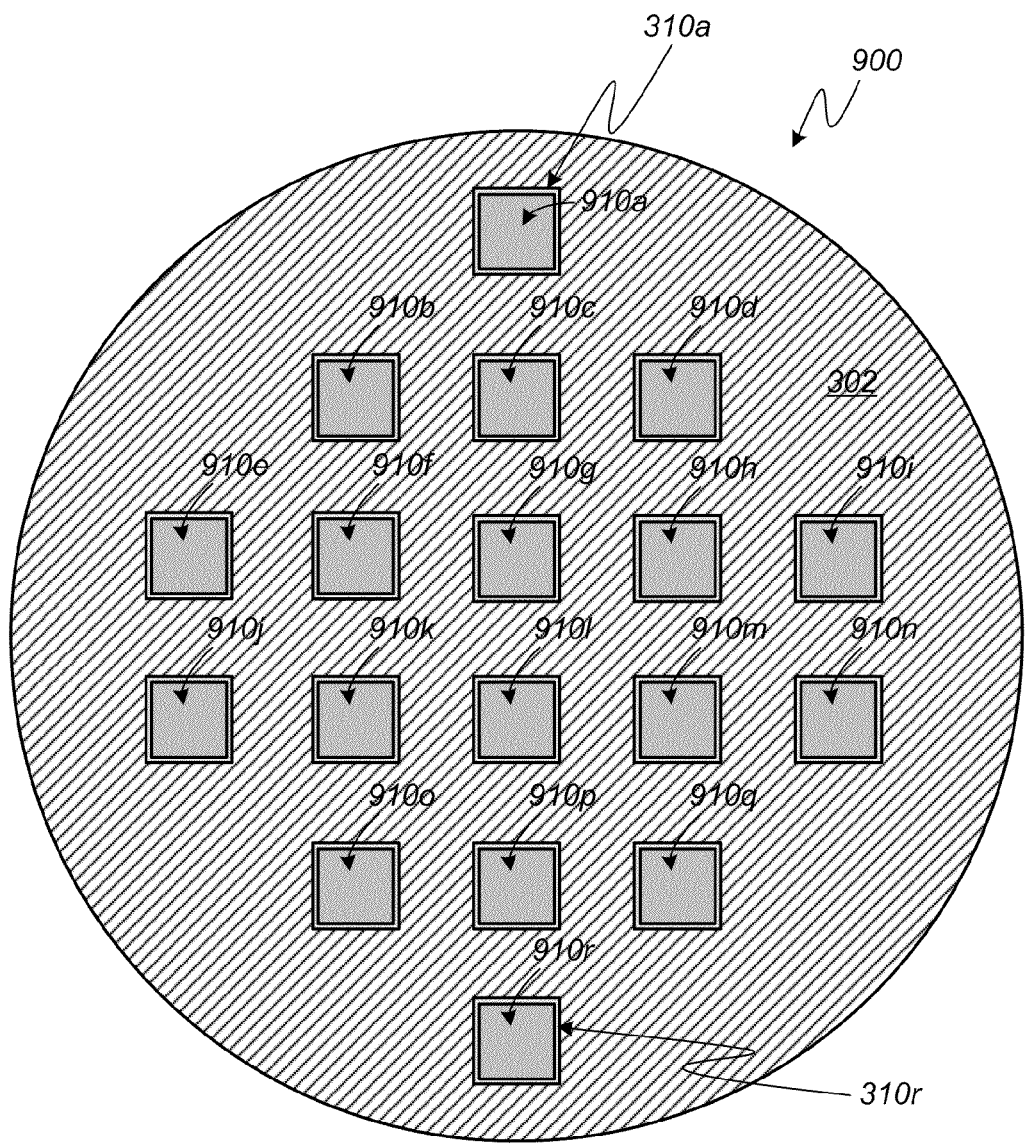
FIG. 9 is a schematic representation of a top plan view of the bonded wafers of FIG. 8 with supplemental-integrated circuits placed in the windows.

FIG. 9 is a schematic representation of a top plan view of a stacked-die assembly 900 formed by the bonded wafers of FIG. 8. The stacked-die assembly 900 reveals the upper surface 302 of the second wafer 300 of FIG. 3 in registration with and bonded to the first wafer 100 of FIG. 1. As further shown in FIG. 9, each of the windows 310a-310r through the second wafer 300 are filled with a respective supplemental-integrated circuit 910a-910r. The area of each of the supplemental-integrated circuits 910a-910r is smaller than the area of the corresponding ASIC 110a-110r upon which the supplemental-integrated circuits 910a-910r are coupled. Each of the respective supplemental-integrated circuits 910a-910r is closely received within the corresponding window 310a-310r with a relatively small buffer region defined as a difference in the area of the window 310 and the area of the corresponding supplemental-integrated circuit.

As described above, once all the windows 310 have been filled with a supplemental-integrated circuit 910, a batch process can be performed to bond or otherwise couple the active surface 102 of the ASIC 110 to a respective active surface (not shown) of the supplemental-integrated circuit 910. A suitable bond process may include the combination of temperature cycling and pressure to form the bond. An alternative bonding or coupling procedure may use thermal cycling alone in conjunction with the introduction of solder bumps to one of the active surface 102 or the active or bonding surface of the supplemental-integrated circuit 910.

As further described above, the supplemental-integrated circuit 910 includes circuits that are different from circuit elements in the ASIC 110. For example, the supplemental-integrated circuit 910 includes circuit elements such as memory elements that are optimally manufactured using a different technique or manufacturing process than that used to produce the ASICs 110a-110r. In addition, circuit elements in the supplemental-integrated circuit 910 may be produced using a different manufacturing technique than that used to form circuit elements (e.g., the trench capacitors) in the second wafer 300' (FIG. 5). Moreover, supply voltages provided to circuits within each of the ASIC 110, the supplemental-integrated circuit 700 and the second wafer 300' may be the same or different from each other as may be desired.

Figure 10A:
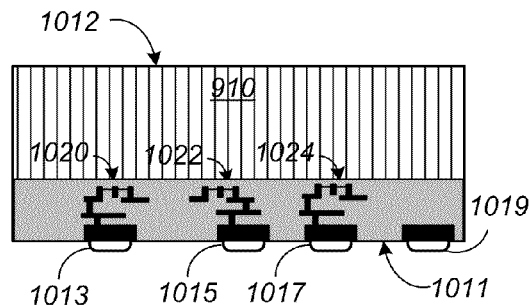
FIG. 10A is a cross-sectional view of an embodiment of a supplemental-integrated circuit.

FIG. 10A is a cross-sectional view of an embodiment of a supplemental-integrated circuit 910. The supplemental-integrated circuit 910 has an active or bonding surface 1011 and an opposed or backside surface 1012. The supplemental-integrated circuit 910, which in some embodiments may include a DRAM, is depicted with active circuit elements. For example, the supplemental-integrated circuit 910 includes transistor 1020, transistor 1022, and transistor 1024. The transistor 1020 is electrically coupled to a contact pad which supports a solder bump 1013. The transistor 1022 is electrically coupled to a respective contact pad which supports solder bump 1015. The transistor 1024 is electrically coupled to a respective contact pad which supports solder bump 1017. The supplemental-integrated circuit 910 includes an additional contact pad which supports solder bump 1019. The additional contact pad provides for additional connectivity and heat transfer when coupled to the ASIC 110a, even though the additional contact pad is not coupled to a circuit element.

Figure 10B:
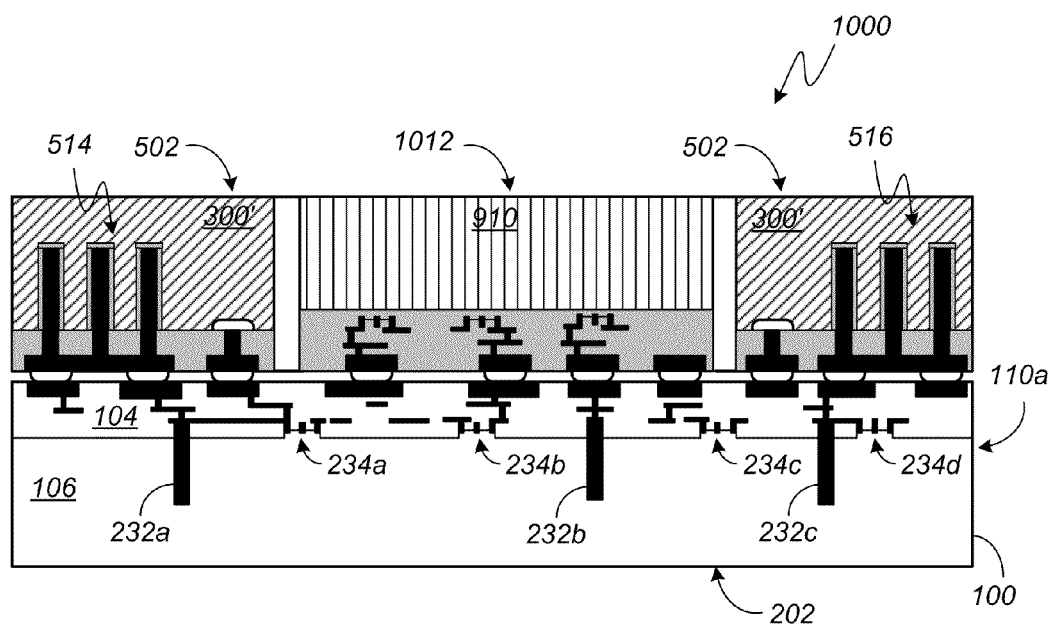
FIG. 10B is a cross-sectional view of an embodiment of a stacked-die assembly formed from the portion of the second wafer of FIG. 4 in registration with the portion of the ASIC of FIG. 2 with the supplemental-integrated circuit of FIG. 10A in the window and coupled to the ASIC.

FIG. 10B is a cross-sectional view of an embodiment of a portion of the stacked-die integrated circuit package of FIG. 9 with the supplemental-integrated circuit 910 bonded to the active surface 102 or region of an example ASIC 110a formed on the first wafer 100. As shown in FIG. 10B the exposed surface 502 of the second wafer 300' and the opposed or backside surface 1012 of the supplemental-integrated circuit 910 are substantially coplanar. Consequently, the stacked-die integrated circuit package 1000 formed by the bonded combination of the first wafer 100, the second wafer 300' and the supplemental-integrated circuit 910 provides multiple connections for the transfer of heat in an upward direction away from the ASIC 110a as well as an increase in surface area to serve as a suitable base for a later applied heat sink or heat sinks. The stacked-die integrated circuit package 1000 is shown after singulation or separation of the ASIC 110a and a similarly sized portion of the second wafer 300'.

Figure 10C:
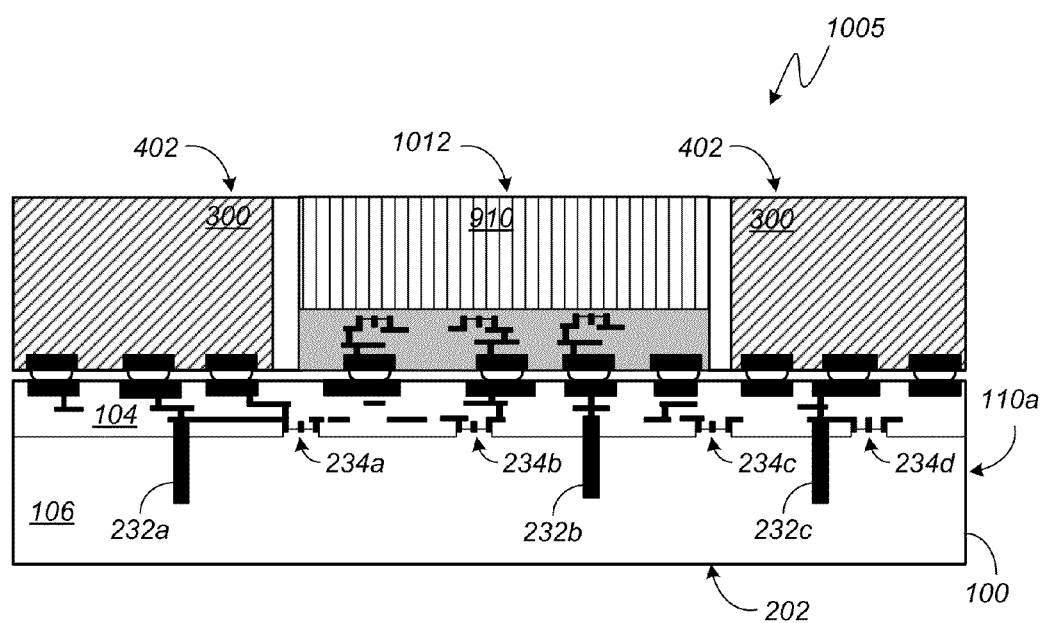
FIG. 10C is a cross-sectional view of an embodiment of a stacked-die assembly formed from the portion of the second wafer of FIG. 5 in registration with the portion of the ASIC of FIG. 2 with the supplemental-integrated circuit of FIG. 10A in the window and coupled to the ASIC.

FIG. 10C is a cross-sectional view of an embodiment of a portion of the stacked-die integrated circuit package of FIG. 9 with the supplemental-integrated circuit 910 bonded to the active surface or region of an example ASIC 110a formed on the first wafer 100. As shown in FIG. 10C the exposed surface 402 of the second wafer 300 and the opposed or backside surface 1012 of the supplemental-integrated circuit 910 are substantially coplanar. Consequently, the stacked-die integrated circuit package 1005 formed by the bonded combination of the first wafer 100, the second wafer 300 and the supplemental-integrated circuit 910 provides multiple connections for the transfer of heat in an upward direction away from the ASIC 110a as well as an increase in surface area to serve as a suitable base for a later applied heat sink or heat sinks. The stacked-die integrated circuit package 1005 is shown after singulation or separation of the ASIC 110a and a similarly sized portion of the second wafer 300.

Figure 11:
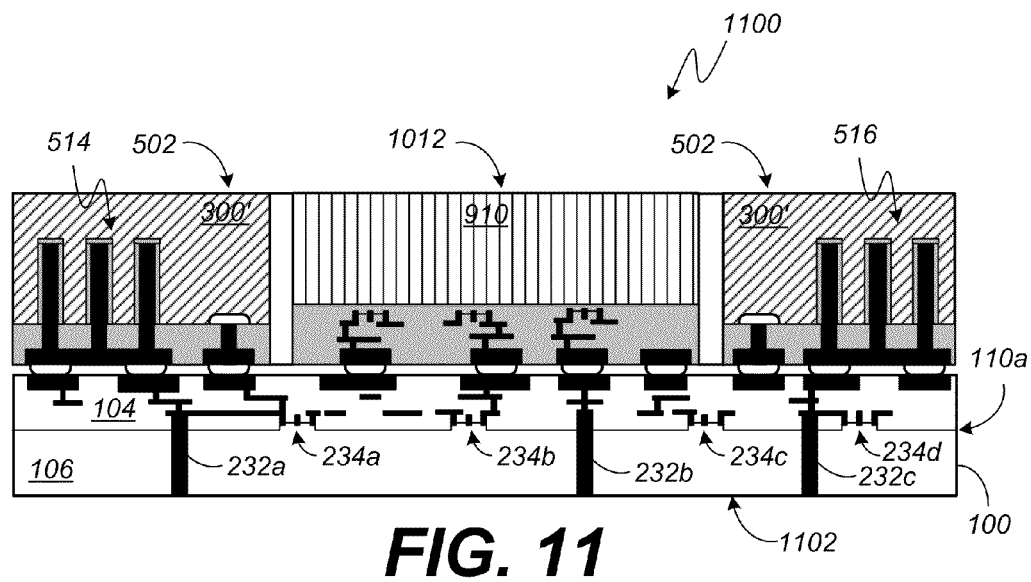
FIG. 11 is a cross-sectional view of an embodiment of the stacked-die assembly of FIG. 10B after processing to expose through wafer vias.

FIG. 11 is a cross-sectional view of an embodiment of the stacked-die integrated circuit package 1000 of FIG. 10B after processing to expose through-wafer vias 232a, 232b and 232c. After the above-described processing, the thickness of the first wafer 100 is reduced by a length necessary to form surface 1102, which exposes each of the through-wafer vias 232a-232c in the stacked-die integrated circuit package 1100. As described above, the additional surface area provided by the second wafer 300' together with the contacts and solder bumps provide mechanical support for a polishing or grinding of the backside surface 202 of the first wafer 100.

Figure 12:
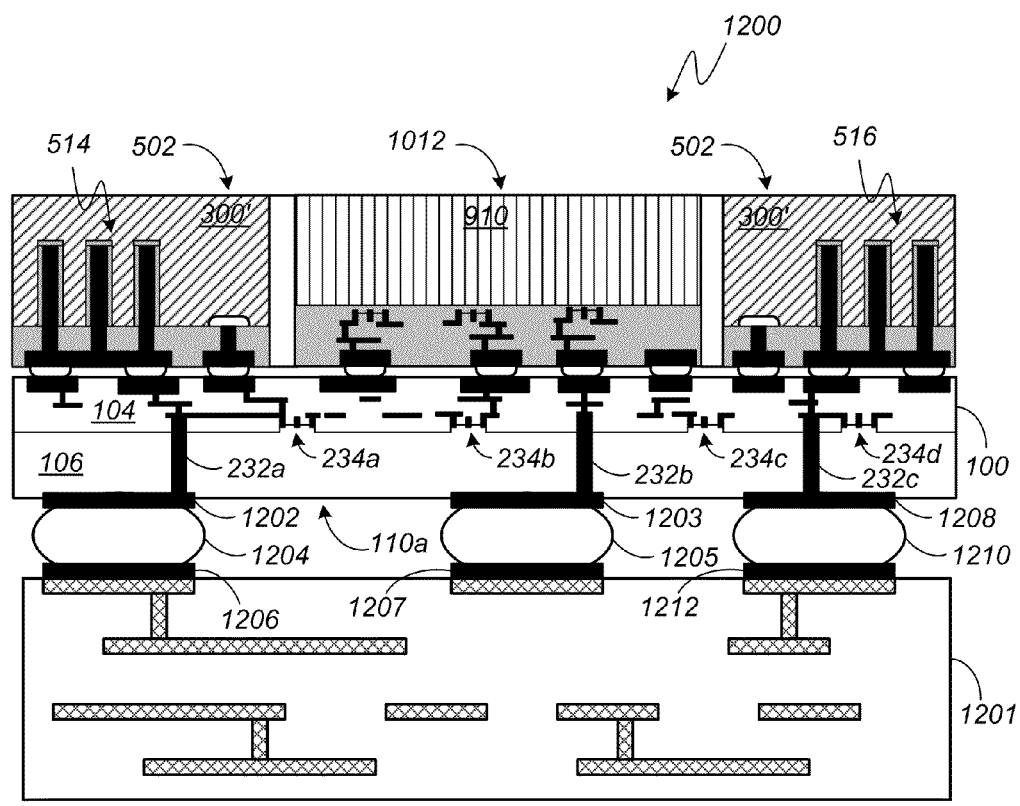
FIG. 12 is a cross-sectional view of an embodiment of the stacked-die assembly of FIG. 10B after attaching the bonded wafers to a package substrate.

FIG. 12 is a cross-sectional view of an embodiment of the stacked-die integrated circuit package 1100 of FIG. 11 after the addition of a package substrate 1201. As illustrated in the FIG. 12, the package substrate 1201 is physically and electrically coupled to the through-wafer vias 232a-232c through corresponding contact pads and a solder ball. For example, through-wafer via 232a is physically and electrically coupled to a first contact pad 1202, a solder ball 1204 and a second contact pad 1206, which is further physically and electrically coupled to the package substrate 1201. Similarly, through-wafer via 232b is physically and electrically coupled to a third contact pad 1203, a second solder ball 1205 and a fourth contact pad 1207, which is physically and electrically coupled to the package substrate 1201. In addition, through-wafer via 232c is physically and electrically coupled to a fifth contact pad 1208, a third solder ball 1210 and a sixth contact pad 1212, which is also coupled to the package substrate 1201. Although not shown in the illustrated embodiment, an insulating layer may be deposited, grown or otherwise added to the surface 902 prior to adding the contact pads 1202, 1203 and 1208. The combination of the above-described multiple wafer integrated circuit 1100 and the package substrate 1201 produces the stacked-die integrated circuit package 1200 shown in FIG. 12.

Figure 13:
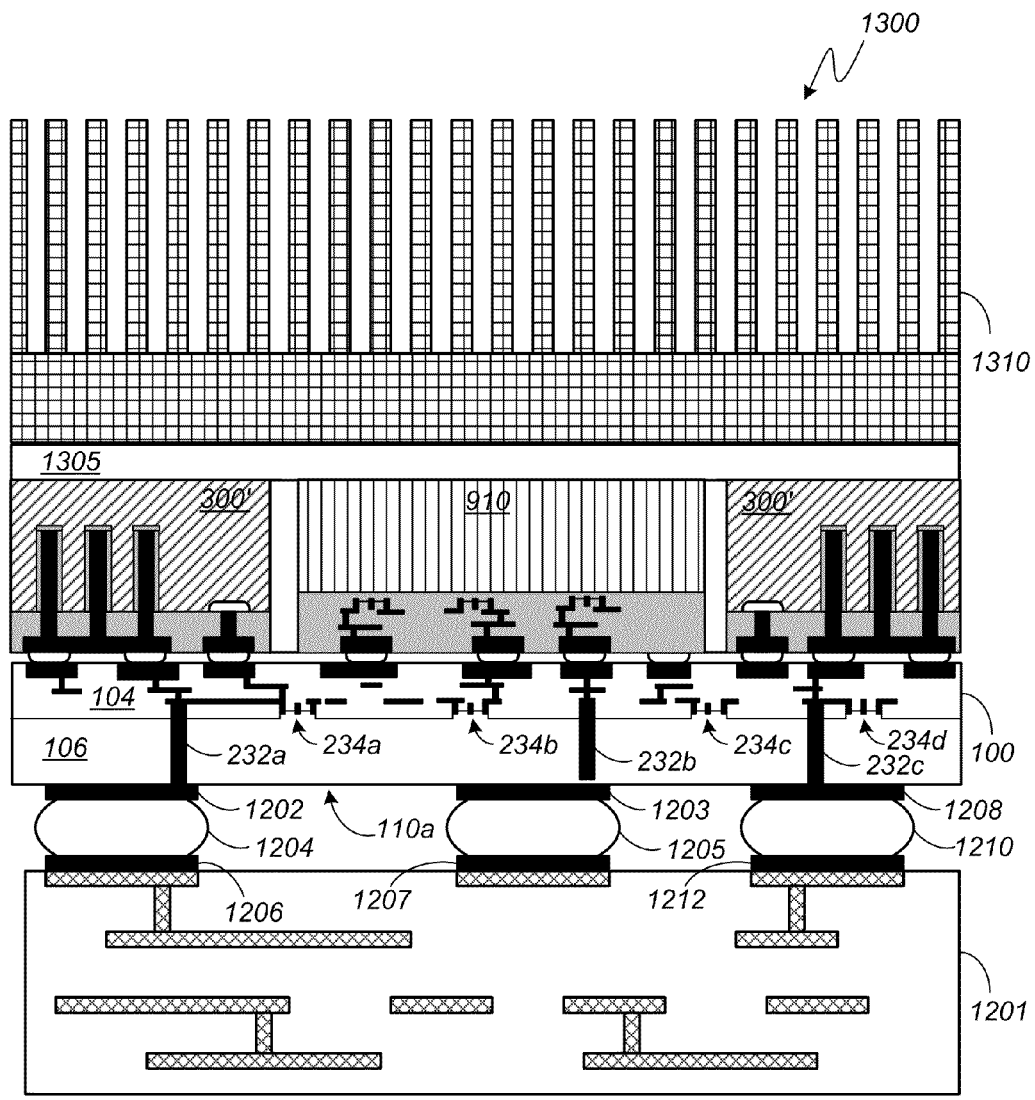
FIG. 13 is a cross-sectional view of an embodiment of the stacked-die assembly of FIG. 10B after application of a thermally conductive layer and attaching a heat sink.

FIG. 13 is a cross-sectional view of an embodiment of the stacked-die integrated circuit package 1200 shown in FIG. 12 after further assembly. The stacked-die integrated circuit package 1300 further includes a heat sink 1310 and a layer of mechanically compliant, thermally conductive material 1305. This material fills the gap between the heat sink 1310 and any nonplanarity of the combined surfaces of the supplemental die 910 and the second wafer or support ring 300' as well as absorbs the thermal expansion mismatch between the second wafer 300' and the heat sink 1310. As explained above, the second wafer 300' is made from a select semiconductor material such as silicon, while the heat sink 1310 is preferably made of a metal such as aluminum or copper. As illustrated in FIG. 13, the layer of thermally conductive material 1305 is applied to the uppermost surfaces of the second wafer 300' and the supplemental-integrated circuit 910, with the heat sink 1310 applied on the thermally-conductive material 1305.

Figure 14:
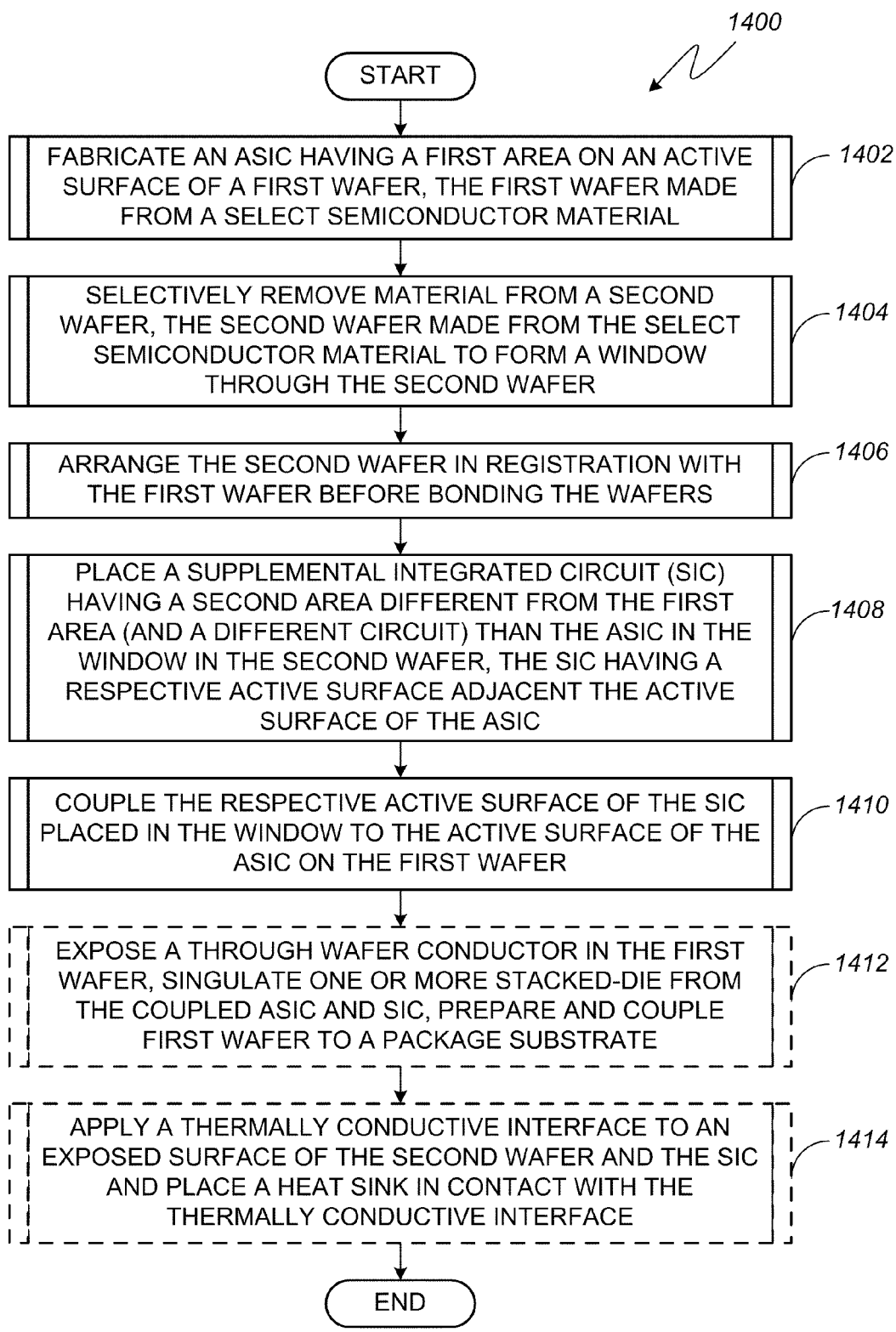
FIG. 14 is a flow chart illustrating an embodiment of a method for facilitating the stacking of integrated circuits having different areas to construct a stacked-die integrated circuit package.

FIG. 14 is a flow chart illustrating an embodiment of a method 1400 for constructing a stacked-die integrated circuit package. The method 1400 begins with block 1402, where an ASIC 110 having a first area is formed or fabricated on an active surface 102 of a first wafer 100. As further indicated in block 1402, the first wafer 100 is made from a select semiconductor material such as doped silicon. In a previous, subsequent or concurrent process step, as indicated in block 1404, material is selectively removed from a second wafer 300 made from the select semiconductor material. As further indicated in block 1404, the removal of the material forms a window 310 or passage through the second wafer 300. As described above, the window 310 is positioned in the second wafer 300 such that when the first wafer 100 and the second wafer 300 are arranged in registration with each other, the window 310 is above a corresponding mounting location on the active surface 102 of the ASIC 110.

After the functions indicated in blocks 1402 and 1404 have been performed, the second wafer 300 is arranged in registration with the first wafer 100, as indicated in block 1406. As described above, the arrangement can be aided when the first and second wafers have identical shapes and sizes and when a respective index mark or marks are added to the wafers. As further described above, once in registration the second wafer 300 can be bonded or coupled to the first wafer 100. The bonded first and second wafers with the windows 310 provide a template for subsequent placement of an integrated circuit such as a DRAM.

Once the first and second wafers have been suitable arranged in registration and bonded to one another, as indicated in block 1408, a supplemental-integrated circuit 910 having an area that is different from the area of the ASIC 110 (and a different integrated circuit) can be introduced in the window 310 of the second wafer 300 where it is supported by the active surface 102 of the corresponding ASIC 110 formed on the first wafer 100. Thereafter, as indicated in block 1410, the respective active surfaces of the ASIC 110 and the supplemental-integrated circuit 910 are bonded to one another to form a stacked-die integrated circuit In an optional step, as indicated by the dashed lines surrounding block 1412, one or more through-wafer conductors in the first wafer are exposed. As further indicated in block 1412, the one or more stacked-die formed by bonding the supplemental-integrated circuits 910 to the ASICs 110 are singulated or separated from each other in preparation for coupling the same to a package substrate 1201. Although the optional step in block 1412 is illustrated as occurring after the bonding of the active surfaces of the ASIC 110 and the supplemental-integrated circuit 910, it should be understood that the step of exposing the through wafer conductor can be performed anytime after the first wafer 100 has been bonded or coupled to the second wafer 300.

In an additional optional step, as indicated by the dashed lines surrounding block 1414, a thermally conductive interface 1305 is added to the exposed surfaces of the second wafer 300 and the supplemental-integrated circuit 910 coupled to the ASIC 110a and a heat sink 1310 is placed in contact with the thermally conductive interface 1305.

While various example embodiments of the integrated circuit package and method for facilitating the stacking of integrated circuits having different areas have been described, it will be apparent to those skilled in the art that many more embodiments and implementations are possible that are within the scope of this disclosure. For example, the illustrated embodiments shows solder balls and contacts in registration with a TSV to couple the die-stacked integrated circuit to a package. Alternatively, the bump could be connected to the TSV by a metal trace in a redistribution layer. Accordingly, the described integrated circuit packages and methods for their construction are not to be restricted or otherwise limited except in light of the attached claims and their equivalents.

What is claimed is:

1. An integrated circuit package, comprising:
an application specific integrated circuit having a first area on an active surface of a first wafer, the first wafer comprising a select semiconductor material and at least one through wafer via;
a second wafer having a circuit surface coupled to the application specific integrated circuit, the circuit surface of the second wafer coupled to a circuit device that operates with a supply voltage that is different in voltage than an application specific integrated circuit supply voltage coupled to the application specific integrated circuit and a second supply voltage coupled to a supplemental-integrated circuit, the second wafer of the select semiconductor material having at least one window there through, the window sized to closely receive the supplemental-integrated circuit different from the application specific integrated circuit and having a second area different from the first area, the supplemental-integrated circuit further having a respective active surface arranged such that a first conductor on the respective active surface is in registration with a corresponding conductor of the application specific integrated circuit; and
a package substrate coupled to the application specific integrated circuit by the at least one through wafer via.

2. The integrated circuit package of claim 1, wherein the circuit surface of the second wafer is manufactured using a less expensive manufacturing process than that used to produce either the application specific integrated circuit or the supplemental-integrated circuit.

3. The integrated circuit package of claim 1, further comprising:
a thermally conductive interface material in contact with an opposed surface of the second wafer and a backside surface opposed to the respective active surface of the supplemental-integrated circuit; and
a heat sink in contact with the thermally conductive interface material.

4. The integrated circuit package of claim 1, wherein the circuit surface of the second wafer is bonded to the application specific integrated circuit.

5. The integrated circuit package of claim 1, wherein the circuit surface of the second wafer is soldered to the application specific integrated circuit.

6. The integrated circuit package of claim 1, wherein the second wafer is coupled to the application specific integrated circuit in a batch process.

7. The integrated circuit package of claim 1, wherein the first wafer comprises a first index mark.

8. The integrated circuit package of claim 1, wherein the second wafer comprises a second index mark.

9. The integrated circuit package of claim 1, wherein a first manufacturing technique used to form circuit elements in the supplemental integrated circuit is different from a second manufacturing technique used to form circuit elements on the second wafer.

10. The integrated circuit package of claim 1, wherein multiple connections transfer heat away from the application specific integrated circuit.

11. The integrated circuit package of claim 1, wherein the package substrate comprises a base surface.

12. The integrated circuit package of claim 11, further comprising a heat sink in thermal contact with the substrate by way of the base surface.

13. The integrated circuit package of claim 12, further comprising a mechanically compliant thermally conductive material disposed between the base surface and the heat sink.

* * * * *